(12) United States Patent
Eker

(10) Patent No.: US 8,255,892 B2
(45) Date of Patent: Aug. 28, 2012

(54) FLASH MEMORY PROGRAMMING

(75) Inventor: Johan Eker, Lund (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 1572 days.

(21) Appl. No.: 10/598,332

(22) PCT Filed: Jan. 7, 2005

(86) PCT No.: PCT/EP2005/000190
§ 371 (c)(1),
(2), (4) Date: Mar. 9, 2007

(87) PCT Pub. No.: WO2005/085996
PCT Pub. Date: Sep. 15, 2005

(65) Prior Publication Data
US 2007/0220504 A1 Sep. 20, 2007

Related U.S. Application Data

(60) Provisional application No. 60/548,841, filed on Feb. 27, 2004, provisional application No. 60/573,275, filed on May 20, 2004.

(51) Int. Cl.
*G06F 9/45* (2006.01)
(52) U.S. Cl. .................................................. 717/159
(58) Field of Classification Search .............. 717/10, 717/154, 157–159, 162, 168; 365/189.07; 369/47.32; 707/203; 711/171
See application file for complete search history.

(56) References Cited

U.S. PATENT DOCUMENTS

| | | | | |
|---|---|---|---|---|
| 5,920,723 A * | 7/1999 | Peyton et al. | ................. | 717/157 |
| 6,077,315 A * | 6/2000 | Greenbaum et al. | ........... | 717/157 |
| 6,401,182 B1 * | 6/2002 | Sweeney | ....................... | 711/171 |
| 6,560,703 B1 | 5/2003 | Goodman | | |
| 7,543,309 B2 * | 6/2009 | Forin et al. | ..................... | 719/331 |
| 2001/0047512 A1 * | 11/2001 | Szewerenko et al. | ........... | 717/10 |
| 2003/0142556 A1 * | 7/2003 | Lohse et al. | ............. | 365/189.07 |
| 2004/0068719 A1 * | 4/2004 | Liu et al. | ........................ | 717/154 |
| 2004/0260734 A1 * | 12/2004 | Ren et al. | ....................... | 707/203 |
| 2005/0157619 A1 * | 7/2005 | Miyawaki et al. | ......... | 369/47.32 |

FOREIGN PATENT DOCUMENTS

| | | |
|---|---|---|
| EP | 0472812 B1 | 5/1991 |
| WO | WO 03/009136 A | 1/2003 |
| WO | WO 03/025742 A | 3/2003 |
| WO | WO 2004/095457 A | 11/2004 |

OTHER PUBLICATIONS

O'Boyle et al, "Feedback Assisted Iterative Compilation", May 2000, pp. 1-9 <feedbackAssist_Boyle.pdf >.*
Eker, Johan, "Flash memory Programming" Aug. 31, 2005, Appl. No. 4388033.5, EP 1 569 102 A1, pp. 1-14.*

* cited by examiner

*Primary Examiner* — Tuan Anh Vu

(57) ABSTRACT

Disclosed is a method for updating program code stored in a memory, which memory comprises a plurality of memory sectors. The method comprises transforming an updated input code into an updated program code version to be stored in a memory, which memory has stored thereon a current program code version occupying a first set of the memory sectors of the memory, wherein the updated program code version occupies a second set of memory sectors when stored in the memory. The transforming step further comprises receiving a representation of the current program code version; and performing at least one optimization step adapted to decrease the number of memory sectors of the second set of memory sectors occupied by the updated code version that are different from the corresponding memory sectors of the first set of memory sectors occupied by the current program code version.

23 Claims, 2 Drawing Sheets

FLASH MEMORY PROGRAMMING

Figure 1:
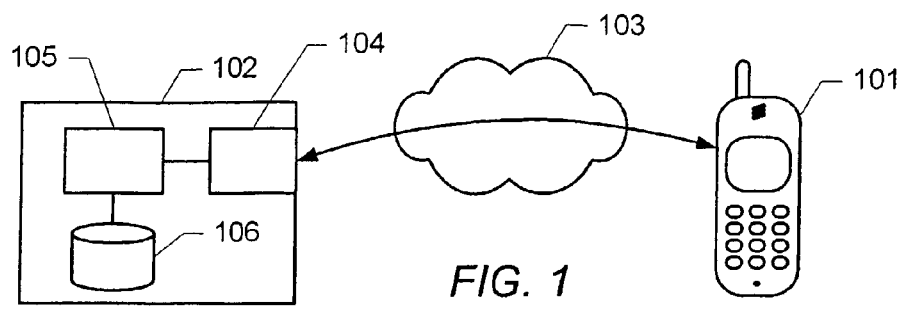

This application claims the benefit of U.S. Provisional Application No. 60/548,841, filed Feb. 27, 2004 and U.S. Provisional Application No. 60/573,275, filed May 20, 2004, the disclosure of which is fully incorporated herein by reference.

This invention relates to the updating of program code stored in a memory, which memory comprises a plurality of memory sectors.

Many modern electronic devices, e.g. embedded devices, are controlled by software stored on flash memory. Flash memory is a popular type of memory in electronic devices, because it allows multiple rewrites. However, the write operations are limited to entire memory sectors, so-called pages, at a time. A typical page size of current flash memories is 64 kbyte.

When the software stored in a flash memory of an electronic device is updated, e.g. in order to add new features to the software and/or to correct errors in the current version of the software, some or all of the memory sectors of the flash memory are re-written or "re-flashed". In general, it is desirable to minimize the number of flash pages that are re-written during a software update, in order to minimize the time required for installing the software update.

In particular, an application where update times are of great concern is the over-the-air (OTA) update of mobile terminals. In such applications, it is known to distribute only modifications to the current image to the mobile terminal rather than the entire updated image. The modifications are generally referred to as delta-files. In such systems, an update agent running on the mobile terminal applies the received modifications to the current image which is thereby transformed to the updated version. It is a particular problem of such update systems that the terminal is not functional during the update process. Hence, it is desirable to reduce the time required for reflashing the memory and, thus, the downtime of the system.

However, due to the constraints of the flash memory mentioned above, even small updates of the source code of the software may cause a large portion of the flash pages to be updated, since changing even a single byte requires an entire page to be completely rewritten.

Published US application 2003/0142556 discloses a method of flash memory programming, wherein volatile information or volatile software components are stored at least near the end of the respective flash memory address space of the flash memory device to keep the need of changing or adjusting flash sectors as slight as possible.

However, the above prior art method requires information about the anticipated likelihood of changing the respective information components. Hence, the above prior art does not address the problem of reducing the number of required re-writes when updating program code in a memory with a plurality of memory sectors, without requiring information about the anticipated likelihood of future changes in the respective software components.

The above and other problems are solved by a method for updating program code stored in a memory, which memory comprises a plurality of memory sectors, the method comprising transforming an updated input code into an updated program code version to be stored in a memory, which memory has stored thereon a current program code version occupying a first set of the memory sectors of the memory, wherein the updated program code version occupies a second set of memory sectors when stored in the memory;

wherein the transforming further comprises
receiving a representation of the current program code version; and
performing at least one optimisation step adapted to decrease the number of memory sectors of the second set of memory sectors occupied by the updated code version that are different from the corresponding memory sectors of the first set of memory sectors occupied by the current program code version.

In particular, by receiving a representation of the current program code version; and performing at least one optimisation process adapted to decrease the number of memory sectors of the second set of memory sectors occupied by the updated code version that are different from the corresponding memory sectors of the first set of memory sectors occupied by the current program code version, the number of required re-writes is reduced.

As the current program code version stored in the memory is generally known to the process that generates a software update, the above optimisation is based on information that is readily available to the updating process. In particular, the process is based on information about the currently installed version and the current update, whereas no information about the likelihood of any future updates is required.

In a preferred embodiment, the representation of the current program code version comprises a current image of the first set of memory sectors and/or a map file description of the current image of the first set of memory sectors. Consequently, the representation comprises information about the layout of the program code components in the memory, thereby allowing the optimisation process to adapt the layout of the updated components as to reduce the differences between both versions.

Typically, a code generation system comprises a compiler which compiles a source code and generates a number of object code modules, and a linker which generates the executable code. The linker resolves dependencies between the set of object code modules that constitute a software development project. The tasks of the linker generally include laying out the object modules in memory, i.e. assigning relative addresses to the different object modules in a corresponding address space. Hence, at the linker stage, the necessary information about the layout of the code in the memory space is available. The object module is typically represented as an object file in a low-level file format that is hardware and/or platform specific. The object file is generated by a compiler and serves as an input to the linker. An object module is typically relocatable and contains unresolved references.

Here the term layout of the code in memory comprises the respective start or base addresses of the different object modules, i.e. their respective relative addresses within the address space occupied by the program code.

Consequently, in a preferred embodiment of the invention, the optimisation process is performed at the linker stage. Hence, the input code comprises a number of object modules and the transforming comprises linking the number of object modules. Preferably, the optimisation process comprises determining the layout of said object modules in memory.

In another preferred embodiment, the input code comprises at least one source code module; the transforming comprises
compiling the at least one source code module resulting in a number of object modules; and
linking the number of object modules;
and performing at least one optimisation step comprises
generating feedback data during the linking step; and re-compiling at least a subset of the source code modules based on the feedback data and resulting in a number of modified object modules; and performing the linking step based on the number of modified object modules.

Consequently, according to this embodiment, the linker generates feedback to the compiler stage causing the compiler to re-compile at least a part of the source code. This has the advantage that the linker controls the resulting set of object modules, thereby increasing the degrees of freedom of re-arranging object code modules by the linker.

In yet another preferred embodiment, the transforming further comprises controlling the optimisation process by at least one optimisation parameter. Hence, a mechanism for controlling the optimisation process is provided. In some embodiments the optimisation parameters determine one or more limitations for the optimisation process. For example, one or more of the optimisation parameters may determine a maximum allowed increase in size caused by the optimisation process such as a maximum size of padding space allowed to be added by the optimisation process. Alternatively or additionally, at least one optimisation parameter may include a parameter determining a maximum allowed number of relays introduced by the optimisation process.

It is an advantage of the invention that the trade-off between the benefits—in terms of the required number of re-writes—and the costs—in terms of memory size, execution time, etc.—of the optimisation process may easily be controlled.

Accordingly, in a preferred embodiment, determining the layout of said object modules in memory comprises detecting an updated first object module having a different size than a corresponding first current object module, and an updated second object module equal to a corresponding second current object module, which updated second object module has a base address larger than the base address of the updated first object module; and padding the detected updated first object module with a predetermined memory content of a predetermined padding size resulting in a padded updated first object module; wherein the padding size is selected to cause the base address of the updated second object module to be equal to the base address of the corresponding second current object module.

In another preferred embodiment, determining the layout of said object modules in memory comprises detecting an updated first object module that is larger than a corresponding first current object module;

moving a predetermined part of the updated first object module to a different memory sector resulting in a reduced updated first object module and a moved part of the updated first object module;

inserting a relay to the moved part of the updated first object module in the reduced first updated memory sector.

In yet another preferred embodiment, the method further comprises generating a delta file representative of differences between the current program code version and the updated program code version. Hence, the resulting delta file includes the differences between the current and updated versions, i.e. the information required for the device to generate the updated version from the current version stored in the device and the delta file. It is an advantage of this embodiment, that the size of the file that needs to be uploaded to the device is reduced, thereby further reducing the time required to perform a software update.

Further preferred embodiments are disclosed in the dependant claims.

It is noted that the features of the method described above and in the following may be implemented in software and carried out on a data processing system or other processing means caused by the execution of program code means such as computer-executable instructions. Here, and in the following, the term processing means comprises any circuit and/or device suitably adapted to perform the above functions. In particular, the term processing means comprises general- or special-purpose programmable microprocessors, Digital Signal Processors (DSP), Application Specific Integrated Circuits (ASIC), Programmable Logic Arrays (PLA), Field Programmable Gate Arrays (FPGA), special purpose electronic circuits, etc., or a combination thereof.

For example, the program code means may be loaded in a memory, such as a RAM, from a storage medium or from another computer via a computer network. Alternatively, the described features may be implemented by hardwired circuitry instead of software or in combination with software.

The present invention can be implemented in different ways including the method described above and in the following, a data processing system, and further product means, each yielding one or more of the benefits and advantages described in connection with the first-mentioned method, and each having one or more preferred embodiments corresponding to the preferred embodiments described in connection with the first-mentioned method.

In particular, the invention relates to a data processing system for updating program code stored in a memory, the memory comprising a plurality of memory sectors, the data processing system being suitably programmed to perform the steps of the method described above and in the following.

The invention further relates to a computer program product comprising program code means adapted to cause a data processing system to perform the method described above and in the following, when said program code means are executed on the data processing system. The computer program product may be embodied as a computer-readable medium having stored thereon said program code means.

For the purpose of the present description, the term electronic device comprises any device comprising a memory such as a flash memory for storing program code. Examples of such devices include portable radio communications equipment and other handheld or portable devices. The term portable radio communications equipment includes all equipment such as mobile telephones, pagers, communicators, i.e. electronic organisers, smart phones, personal digital assistants (PDAs), handheld computers, or the like.

Figure 2:
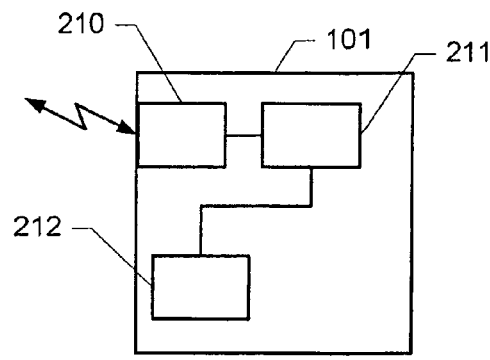
Figure 4:
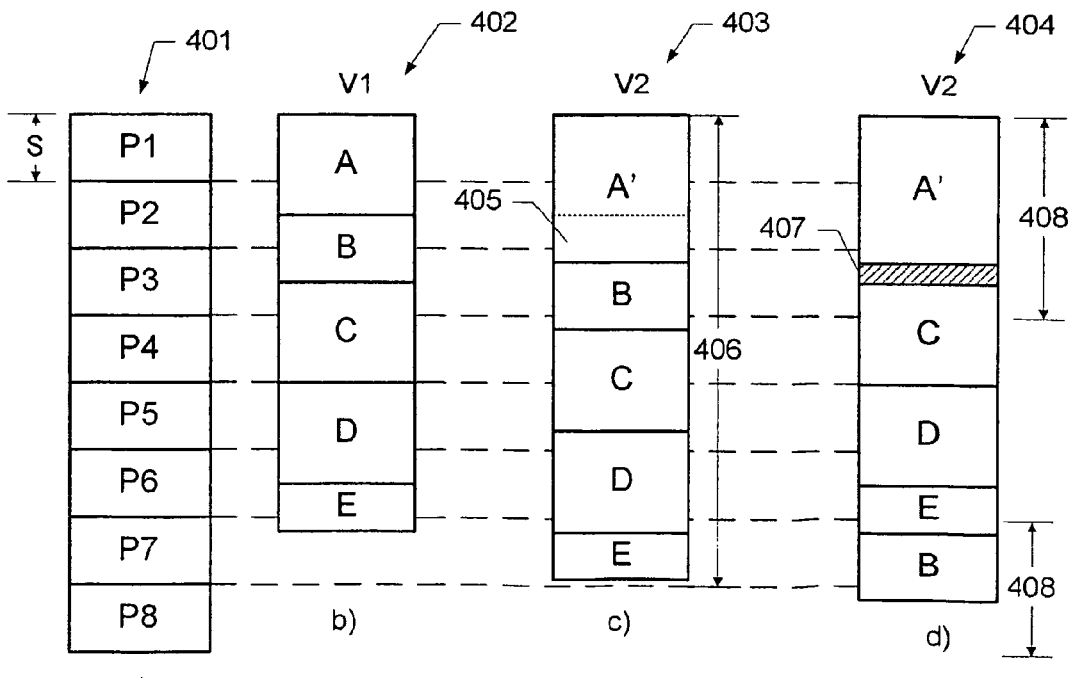
Figure 3:
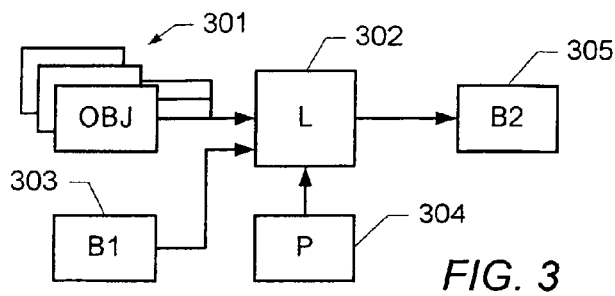
Figure 5:
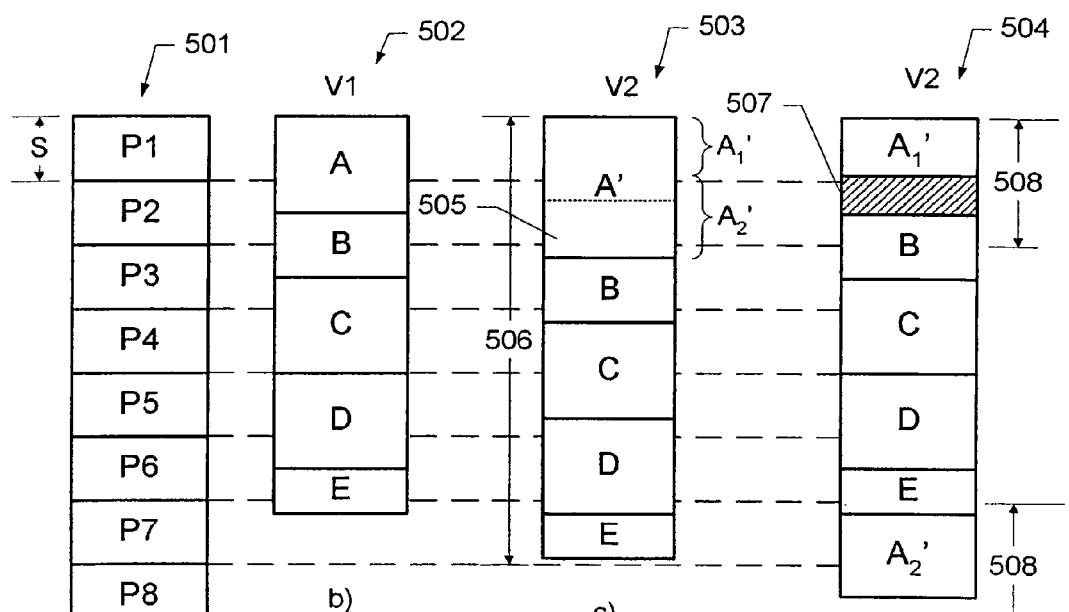
Figure 6:
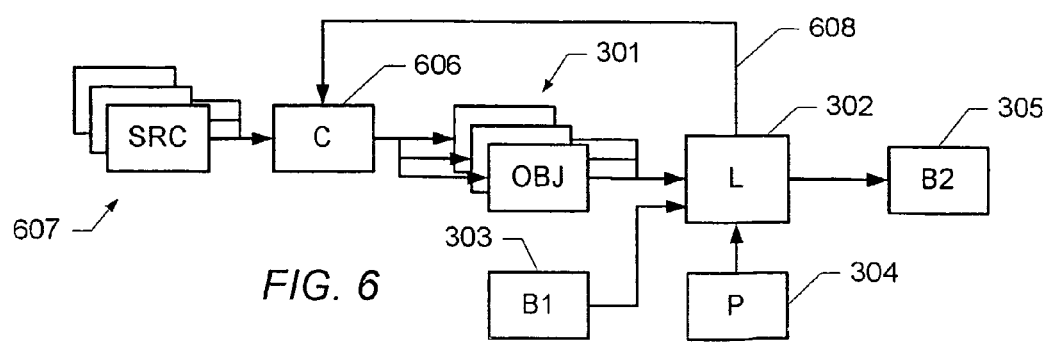

The above and other aspects of the invention will be apparent and elucidated from the embodiments described in the following with reference to the drawing in which:

FIG. 1 schematically shows a block diagram of an embodiment of a system for updating software in a mobile terminal;

FIG. 2 schematically shows a block diagram of a mobile terminal according to an embodiment of the invention;

FIG. 3 shows a block diagram of an embodiment of a software update process;

FIG. 4 schematically illustrates the memory layout of a flash memory before and after a software update where the layout is optimised via an introduction of padding space;

FIG. 5 schematically illustrates the memory layout of a flash memory before and after a software update where the layout is optimised via an introduction of a relay;

FIG. 6 shows a block diagram of another embodiment of a software update process;

FIG. 1 schematically shows a block diagram of an embodiment of a system for updating software in an electronic device such as a mobile terminal. The system comprises a mobile terminal 101, e.g. a mobile telephone or the like, a software updating system 102, and a communications interface 103.

The software updating system 102 may comprise a server computer having access to the communications network. In some embodiments, the functionality of the server computer may be distributed among a plurality of computers, e.g. computers connected via a computer network, e.g. a local area network, a wide area network, an Internet, or the like. The software updating system 102 comprises an interface circuit 104 allowing the software updating system to communicate data via the communications interface 103. For example, the interface circuit may comprise a serial port, a parallel port, a short range wireless communications interface, e.g. an infrared port, a Bluetooth transceiver, or the like. Further examples of interface circuits include a network card, a DSL modem, a gateway computer, or the like.

The software updating system further comprises a processing unit 105, e.g. the CPU of a server computer, suitably programmed to control and perform the update process including the generation of the updated program code as described herein. The processing unit further comprises a version database 106 having stored therein memory images of at least a base version and an updated version of the software to be updated. In some embodiments, the version database may further comprise additional information, e.g. a plurality of base versions and/or updated versions, e.g. for different models of mobile terminals, for different groups of customers, and/or the like.

The communications interface 103 may be any suitable wired or wireless communications interface for communicating data between the software updating system 102 and the mobile terminal 101. For example, in the case of a mobile telephone adapted to communicate via a cellular communications network, e.g. a GSM network, a UMTS network, a GPRS network, or the like, the communication between the software updating system and the mobile terminal in connection with a software update may be performed via that cellular communications network, thereby avoiding the need for additional communications interfaces in the mobile terminal. It is further understood that the communication between the mobile terminal and the software updating system may involve more than one communications networks. For example, the mobile phone may communicate via a base station and a cellular telecom network with a gateway system that, in turn, provides communication with the software updating system via the Internet.

Hence, in order to update software on the mobile terminal 101, e.g. the firmware or operating system of the mobile terminal, the mobile terminal connects to the software updating system 102. Alternatively, the software updating system may connect to the mobile terminal once an updated software version is available. Once connected to the software updating system, the mobile terminal sends information to the software updating system about its current software version. The communication is performed via a suitable updating protocol, e.g. a protocol built on top of a TCI/IP protocol. Based on the information received from the mobile terminal, the software updating system generates a dedicated updating message comprising updating instructions to the mobile terminal. In some embodiments, the updating instructions include the images of the memory sectors to be rewritten. In a differential updating system using delta files, the updating instructions are generated such that they enable the mobile terminal to generate the updated software version from the existing version already stored in the mobile terminal and from additional information included in the updating instructions.

In one embodiment, the update process is initiated by an update agent running on the mobile terminal. The update agent controls the reception and verification of the delta file. Subsequently, the update agent causes the mobile terminal to be disconnected from the network and rebooted in a patch mode. In patch mode, the changes in the delta file are applied incrementally until the new memory image is complete.

The generation of the delta file generation may schematically be illustrated by the following operations $$\text{file}_{new} - \text{file}_{base} \rightarrow \Delta\text{file}.$$

Correspondingly, the actual generation of the new version may then be performed by the mobile terminal according to the following operation $$\text{file}_{base} + \Delta\text{file} \rightarrow \text{file}_{new}.$$

It is understood that the above operations of generating the delta file (denoted as "−" in the above notation) and generating the new version on the mobile terminal (denoted as "+" operation in the above notation) may comprise more or less complex operations.

The delta file may be applied in-place, i.e. the changes are made by the mobile terminal on the existing image, thereby requiring little additional storage. Furthermore, since only the delta file needs to be loaded and since the delta file typically is considerably smaller than the new version, the loading time is reduced by the above method.

Embodiments of the code generation process will be described in greater detail below.

FIG. 2 schematically shows a block diagram of an electronic device such as a mobile terminal. The mobile terminal 101 comprises a communications block 210, a processing unit 211, and s memory unit 212.

The communications block 210 comprises circuitry and/or devices allowing radio-based communication of data via a cellular communications network. Hence, for the purpose of the present description, the communications block 210 comprises receiver circuitry and transmitter circuitry for receiving and transmitting data signals. The communications block may further comprise circuitry for suitably processing the signals, e.g. modulating, coding, amplifying, etc., the signals by suitable techniques well known in the art of radio communications.

The mobile terminal further comprises a processing unit 211, e.g. a suitably programmed microprocessor. The processing unit is adapted to determine the version of the software stored in the mobile terminal, to calculate checksums of the stored software, and to generate an updated version of the software upon receipt of corresponding update instructions.

The memory unit 212 has stored thereon the software and/or other data in a predetermined version. For example, the memory 212 may comprise the firmware of the mobile terminal that implements the basic functions of the mobile terminal when loaded into and executed by the processing unit 210. The firmware may further comprise an operating system allowing application software to be executed. Accordingly, the memory 212 may further have stored thereon application software providing additional functionality. The memory 212 is addressed using a suitable address space, thereby allowing the processing unit to access selected parts of the memory. In some embodiments the memory 212 may be logically or physically divided in a plurality of memory sectors. For example, the memory 212 may comprise flash memory allowing data to be written in sectors of a predetermined size.

In the following, it will be assumed that the memory 212 is divided in a number of sectors of a predetermined size denoted P1, P2, P3, . . . , PN. However, it is understood that any other addressing of the memory may be used, instead. It is further understood that the updating process described herein may be applied to the entire memory 212, e.g. if the entire image of the flash memory of a mobile phone is to be updated, or to only predetermined parts of the memory, e.g. if one or more software applications are to be updated.

FIG. 3 shows a block diagram of an embodiment of a software update process. The linker module 302 receives a number of object files 301. Each of the object files 301 is compiled by a compiler (not shown), wherein some or all of the object files may be compiled separately from each other. The linker module 302 combines the object modules into an absolute file 305 ready for execution. One of the tasks performed by the linker module 302 is the resolution of cross-references among separately compiled object modules and the assigning of final addresses to create a single executable program 305. Hence, the output 305 from the linker is a file that can directly be loaded into the flash memory. The output 305 will also be referred to as a build file.

The linker module 302 further receives information about a previous build file 303, e.g. in the form of an image of the corresponding address space in a flash memory where the current build is stored. In another embodiment, the linker 302 may also generate a text-file representation of the memory layout of the current build, a so-called map file. For example, the map file may comprise a list of functions, the addresses assigned to them, their input parameters, etc. In such an embodiment, the information 303 about the previous build may comprise the corresponding map file of the previous build. In yet another embodiment, the linker module receives both the map file and the memory image of the previous build.

The linker module 302 is adapted to generate the memory image of the new build 305 such that the new image resembles the memory image of the previous build 303 as much as possible. Hence, the linker is adapted to perform a number of optimisation steps in order to reduce the differences between the memory images. Examples of such optimisation steps include:

The introduction of extra padding space between modules in order to avoid the need to move modules around relative to their location in the previous build. This will be illustrated in connection with FIG. 4.

Splitting up an object module into two or more sub-modules with references between them, i.e. introducing so-called relays, as will be illustrated in connection with FIG. 5.

Combinations of the above.

The linker module 302 further receives one or more optimisation parameters 304 for controlling the optimisation steps. For example, the optimisation parameters may determine which optimisation steps the linker should perform. Furthermore, the optimisation parameters may determine a number of limitations or boundary conditions for one or more of the optimisation steps. Hence, the linker may be configured to reduce, preferably to minimize, the difference between the new build and the previous build within a number of limitations or boundary conditions determined by the optimisation parameters.

Example of optimisation parameters include
a maximum bound on the allowed padding space that the linker is allowed to introduce,
a maximum number of relays that the linker is allowed to introduce.

It is understood that, in some embodiments, one or more of the above optimisation parameters may be pre-set to predetermined default values. FIG. 4 schematically illustrates the memory layout of a flash memory before and after a software update where the layout is optimised via an introduction of padding space.

FIG. 4a illustrates the structure of a part of the address space of a flash memory. The address space 401 is divided into a number of pages denoted P1, P2, P3, P4, P5, P6, P7, and P8. The pages have a predetermined size S; in a typical conventional flash memory the page size is 64 kbyte.

FIG. 4b illustrates an example of the memory layout of a program code version V1, generally referred to by reference numeral 402, stored in the address space 401. The program code version in this example comprises five object modules designated A, B, C, D, and E. The object modules have different sizes and are sequentially arranged in the address space 401. This layout is also referred to as a monolith.

FIG. 4c illustrates an updated version V2 of the program code, generally designated 403. In this example, it is assumed that the only change between version V1 and version V2 is the replacement of module A by module A', where the module A' is assumed to be larger than the previous module A as illustrated by the additional memory space 405 required for A'. The remaining modules B, C, D, and E are assumed to be unchanged, i.e. identical to the corresponding portion of version V1. However, as is illustrated by reference numeral 406 in FIG. 4c, when sequentially arranging the updated version V2, the entire content of memory pages P1 through P7 need to be rewritten.

Pages P1, P2, and P3 need to be rewritten, because the content of module A has changed to A', and the remaining pages need to be rewritten because the location of the modules B, C, D, and E is changed between versions V1 and V2.

FIG. 4d illustrates an optimised memory layout of the updated program version V2, generally designated 404. In the example of FIG. 4d, the linker has moved module B to the end of the monolith. Furthermore, the linker has inserted a padding space of unused memory 407 between modules A' and C. The size of the padding space 407 is determined as to allow the start address of module C in version V2 to be the same as in the previous version V1. Consequently, the memory image of modules C, D, and E is unchanged, assuming that they do not reference entities in module B, i.e. that no references are changed. Hence, when updating the memory with the optimised updated version V2 to replace the previous version V1, i.e. by re-flashing the relevant pages of a flash memory, only pages P1, P2, P3, P7, and P8 need to be re-written, as illustrated by reference numeral 408. The remaining pages, i.e. pages P4, P5, and P6 need not be re-written.

It is understood that, in a situation where A' is smaller than A, the layout may be optimised by merely adding a suitable padding space ensuring an unchanged base address of module B, i.e. without moving B.

It is further understood that the above optimisation of the memory layout by adding a padding space reduces the number of necessary re-writes at the cost of an increased size of the memory image corresponding to the size of the additional padding space. As mentioned above, this trade-off can be controlled by a optimisation parameter that determines the maximum size of padding space allowed to be inserted by the linker.

It is further noted that the relocation of memory module B in the above example may induce changes in one or more of the modules C, D, and E, if they include references to functions in module B. Such references would be affected by a re-addressing of module B. Modules which no other functions in the unchanged modules refer to, may be freely moved, while a movement of a module that is reference by an otherwise unchanged module increases the cost in terms of the number of required re-writes. Consequently, it is preferred that the linker is configured to determine the total effect/cost of the movement of an object module in order to determine whether and which modules to move.

Hence, in one embodiment, the determination of the layout of the object modules in memory comprises
  detecting an updated first object module having a different size than a corresponding first current object module, and an updated second object module equal to a corresponding second current object module, which updated second object module has a base address larger than the base address of the updated first object module; and
  padding the detected updated first object module with a predetermined memory content of a predetermined padding size resulting in a padded updated first object module; wherein the padding size is selected to cause the base address of the updated second object module to be equal to the base address of the corresponding second current object module.

FIG. 5 schematically illustrates the memory layout of a flash memory before and after a software update where the layout is optimised via an introduction of a relay.

FIG. 5a illustrates the structure of a part of the address space of a flash memory. The address space 501 is divided into a number of pages denoted P1, P2, P3, P4, P5, P6, P7, and P8. The pages have a predetermined size S.

FIG. 5b illustrates an example of the memory layout of a program code version V1, generally referred to by reference numeral 502, stored in the address space 501. As in the previous example, the program code version comprises five object modules designated A, B, C, D, and E. The object modules have different sizes and are sequentially arranged in the address space 501.

FIG. 5c illustrates an updated version V2 of the program code, generally designated 503. Again, it is assumed that the only change between version V1 and version V2 is that module A is replaced by module A', where the module A' is assumed to be larger than the previous module A as illustrated by the additional memory space 505 required for A'. The remaining modules B, C, D, and E are assumed to be unchanged, i.e. identical to the corresponding portion of version V1. However, as is illustrated by reference numeral 506 in FIG. 5c, when sequentially arranging the updated version V2, the entire content of memory pages P1 through P7 need to be rewritten. Pages P1, P2, and P3 need to be rewritten, because the content of module A has changed to A', and the remaining pages need to be rewritten because the location of the modules B, C, D, and E is changed between versions V1 and V2.

FIG. 5d illustrates an optimised memory layout of the updated program version V2, generally designated 504. In the example of FIG. 5, it is assumed that a part of the object module A' is only referenced from within A', i.e. not from any of the other modules. This part of A' is denoted $A_2'$. The remaining part of A', denoted $A_1'$, is referenced from one or more of the other modules. Consequently, as illustrated in FIG. 5d, the linker module may split up module A' into $A_1'$ and $A_2'$, and move module $A_2'$ to the end of the monolith and change the internal references in $A_1'$ to $A_2'$ accordingly, i.e. by introducing a relay. Furthermore, the linker inserts a padding space 507 such that the start address of module B remains unchanged compared to the previous version V1. Consequently, the memory image of modules B, C, D, and E is unchanged. Hence, when uploading the optimised updated version V2 to replace the previous version V1, only pages P1, P2, P7, and P8 need to be re-written, as illustrated by reference numeral 508. The remaining pages, i.e. pages P3, P4, P5, and P6 need not be re-written.

Hence, in this embodiment, the determination of the layout of the object modules in memory comprises
  detecting an updated first object module that is larger than a corresponding first current object module;
  moving a predetermined part of the updated first object module to a different memory sector resulting in a reduced updated first object module and a moved part of the updated first object module;
  inserting a relay to the moved part of the updated first object module in the reduced first updated memory sector.

It is understood that the above optimisation of the memory layout by relaying reduces the number of necessary rewrites at the cost of an execution time penalty due to the relay. As mentioned above, this trade-off can be controlled by a optimisation parameter that determines the maximum number of relays allowed to be inserted by the linker.

It is further noted that in the example of FIG. 5, the introduction of a relay is combined with the insertion of padding space.

It is further understood that, in other embodiments, the splitting up of a module in two separate modules is performed by a compiler rather than the linker itself. Such an embodiment, in which the linker sends a feedback signal to the compiler, will be described in the following:

FIG. 6 shows a block diagram of another embodiment of a software update process. This embodiment is similar to the embodiment described in connection with FIG. 3, where like reference numerals refer to the same components. In the embodiment of FIG. 6, the linker 302 further generates a feedback signal 608 to the compiler 606 that has generated the object files 301 from a corresponding set of source files 607. The feedback signal causes the compiler to re-compile one or more of the source files resulting in modified object files that are more suitable for the generation of the optimised memory layout by the linker. In the situation illustrated in FIG. 5 for example, the linker 302 may request the compiler 606 to generate object modules $A_1'$ and $A_2'$ instead of A'. In one embodiment, the feedback signal 608 may even include information about which functions to include in each of the sub-modules.

Hence, in the above, a linker is disclosed that is configured to reduce the number of rewrites required when updating program code in a flash memory.

The invention can be implemented by means of hardware comprising several distinct elements, and by means of a suitably programmed computer. In the device claims enumerating several means, several of these means can be embodied by one and the same item of hardware, e.g. a suitably programmed microprocessor or computer, and/or one or more communications interfaces as described herein. The mere fact that certain measures are recited in mutually different dependent claims or described in different embodiments does not indicate that a combination of these measures cannot be used to advantage.

It should be emphasized that the term "comprises/comprising" when used in this specification is taken to specify the presence of stated features, integers, steps or components but does not preclude the presence or addition of one or more other features, integers, steps, components or groups thereof.

The invention claimed is:
1. A method for updating program code stored in a memory, the memory having a plurality of memory sectors, the method comprising the steps of:

transforming at least one updated source code module into an updated program code version to be stored in a memory, which memory has stored thereon a current program code version occupying a first set of the memory sectors of the memory, wherein the updated program code version occupies a second set of memory sectors when stored in the memory;

wherein the transforming step further comprises the steps of compiling the at least one source code module resulting in a number of object modules, receiving a representation of the current program code version, performing at least one optimization step adapted to decrease the number of memory sectors of the second set of memory sectors occupied by the updated code version that are different from the corresponding memory sectors of the first set of memory sectors occupied by the current program code version, and controlling the at least one optimization step by at least one optimization parameter, wherein the at least one optimization parameter includes a maximum bound on allowed padding space that a linker is allowed to introduce or a maximum number of relays that the linker is allowed to introduce; and wherein the performing at least one optimization step, further comprises the steps of generating feedback data during a linking step for linking the number of object modules, re-compiling at least a subset of the source code modules based on the feedback data and resulting in a number of modified object modules, and performing a linking step based on the number of modified object modules.

2. The method according to claim 1, wherein the representation of the current program code version comprises at least one of a current image of the first set of memory sectors and a map file description of the current image of the first set of memory sectors.

3. The method according to claim 1, wherein the optimization step further comprises the step of determining a layout of the object modules in memory.

4. The method according to claim 3, wherein determining the layout of the object modules in memory further comprises the steps of:

detecting an updated first object module having a different size than a corresponding first current object module, and an updated second object module equal to a corresponding second current object module, which updated second object module has a base address larger than the base address of the updated first object module; and padding the detected updated first object module with a predetermined memory content of a predetermined padding size resulting in a padded updated first object module; wherein the padding size is selected to cause the base address of the updated second object module to be equal to the base address of the corresponding second current object module.

5. The method according to claim 3, wherein determining the layout of the object modules in memory further comprises the steps of:

detecting an updated first object module that is larger than a corresponding first current object module;

moving a predetermined part of the updated first object module to a different memory sector resulting in a reduced updated first object module and a moved part of the updated first object module; and inserting a reference to the moved part of the updated first object module in the reduced first updated memory sector.

6. The method according to claim 1, wherein the at least one optimization parameter includes a parameter determining a maximum allowed increase in size caused by the optimization step.

7. The method according to claim 1, wherein the at least one optimization parameter includes a parameter determining a maximum allowed number of references introduced by the optimization step.

8. The method according to claim 1, further comprising generating a delta file representative of differences between the current program code version and the updated program code version.

9. The method according to claim 1, wherein the memory is a flash memory.

10. The method according to claim 1, wherein the memory is a memory of a portable radio communications equipment.

11. A data processing system for updating program code stored in a memory, the memory having a plurality of memory sectors, the data processing system comprising:

transformation means adapted to transform at least one updated source code module into an updated program code version to be stored in a memory, which memory has stored thereon a current program code version occupying a first set of the memory sectors of the memory, wherein the updated program code version occupies a second set of memory sectors when stored in the memory;

the transformation means further having a compilation means adapted to compile the at least one source code module resulting in a number of object modules, a reception means adapted to receive a representation of the current program code version, and a performance means adapted to perform at least one optimization operation to decrease the number of memory sectors of the second set of memory sectors occupied by the updated code version that are different from the corresponding memory sectors of the first set of memory sectors occupied by the current program code version; and wherein the performance means adapted to perform the at least one optimization operation is further adapted to generate feedback data while the number of object modules are being linked, re-compile at least a subset of the source code modules based on the feedback data resulting in a number of modified object modules, and perform a linking operation based on the number of modified object modules, wherein the at least one optimization operation is controlled by at least one optimization parameter and the at least one optimization parameter includes a maximum bound on allowed padding space that a linker is allowed to introduce or a maximum number of relays that the linker is allowed to introduce.

12. The data processing system according to claim 11, wherein the representation of the current program code version comprises at least one of a current image of the first set of memory sectors and a map file description of the current image of the first set of memory sectors.

13. The data processing system according to claim 11, wherein the optimization operation is adapted to determine a layout of the object modules in memory.

14. The data processing system according to claim 13, wherein the determination of the layout of the object modules in memory further comprises:
   a detection operation adapted to detect an updated first object module having a different size than a corresponding first current object module, and an updated second object module equal to a corresponding second current object module, which updated second object module has a base address larger than the base address of the updated first object module; and
   a padding operation adapted to pad the detected updated first object module with a predetermined memory content of a predetermined padding size resulting in a padded updated first object module; wherein the padding size is selected to cause the base address of the updated second object module to be equal to the base address of the corresponding second current object module.

15. The data processing system according to claim 13, wherein the determination of the layout of the object modules in memory further comprise:
   a detection operation adapted to detect an updated first object module that is larger than a corresponding first current object module;
   a movement operation adapted to move a predetermined part of the updated first object module to a different memory sector resulting in a reduced updated first object module and a moved part of the updated first object module; and
   an insertion operation adapted to insert a reference to the moved part of the updated first object module in the reduced first updated memory sector.

16. The data processing system according to claim 11, wherein the transformation operation is further adapted to control the optimization operation by at least one optimization parameter.

17. The data processing system according to claim 16, wherein the at least one optimization parameter includes a parameter determining a maximum allowed increase in size caused by the optimization step.

18. The data processing system according to claim 16, wherein the at least one optimization parameter includes a parameter determining a maximum allowed number of references introduced by the optimization step.

19. The data processing system according to claim 11, further comprising a generation operation adapted to generate a delta file representative of differences between the current program code version and the updated program code version.

20. The data processing system according to claim 11, wherein the memory is a flash memory.

21. The data processing system according to claim 11, wherein the memory is a memory of a portable radio communications equipment.

22. A computer program product comprising program code means adapted to cause a data processing system to perform steps when the program code means are executed on the data processing system, the steps comprising:
   transforming at least one updated source code module into an updated program code version to be stored in a memory, which memory has stored thereon a current program code version occupying a first set of the memory sectors of the memory, wherein the updated program code version occupies a second set of memory sectors when stored in the memory;
   wherein the transforming step further comprises the steps of
      compiling the at least one source code module resulting in a number of object modules,
      receiving a representation of the current program code version,
      performing at least one optimization step adapted to decrease the number of memory sectors of the second set of memory sectors occupied by the updated code version that are different from the corresponding memory sectors of the first set of memory sectors occupied by the current program code version, and
      controlling the at least one optimization step by at least one optimization parameter, wherein the at least one optimization parameter includes a maximum bound on allowed padding space that a linker is allowed to introduce or a maximum number of relays that the linker is allowed to introduce; and
   wherein performing the at least one optimization step, further comprises the steps of generating feedback data during a linking step for linking the number of object modules, re-compiling at least a subset of the source code modules based on the feedback data and resulting in a number of modified object modules, and performing a linking step based on the number of modified object modules.

23. The computer program product according to claim 22, wherein the computer program product comprises a linker module.

* * * * *